(12) United States Patent
Lu et al.

(10) Patent No.: US 7,157,331 B2
(45) Date of Patent: Jan. 2, 2007

(54) ULTRAVIOLET BLOCKING LAYER

(75) Inventors: Chien Hung Lu, Kaohsiung (TW); Chin Ta Su, Yunlin County (TW)

(73) Assignee: Macronix International Co., Ltd., Hsinchu (TW)

( * ) Notice: Subject to any disclaimer, the term of this patent is extended or adjusted under 35 U.S.C. 154(b) by 44 days.

(21) Appl. No.: 10/858,352

(22) Filed: Jun. 1, 2004

(65) Prior Publication Data

US 2005/0275105 A1 Dec. 15, 2005

(51) Int. Cl.
*H01L 21/336* (2006.01)
*H01L 21/8234* (2006.01)
*H01L 21/44* (2006.01)
*H01L 31/0288* (2006.01)
*H01L 29/80* (2006.01)
*H01L 29/76* (2006.01)

(52) U.S. Cl. .................. 438/257; 438/694; 438/597; 438/758; 438/759; 438/760; 438/761; 438/762; 438/763; 438/764; 438/795; 257/410; 257/258; 257/432; 257/288; 257/317; 257/E21.53

(58) Field of Classification Search ............... 438/597, 438/758–795, 257, 694; 257/410, 258, 432, 257/288, 317
See application file for complete search history.

(56) References Cited

U.S. PATENT DOCUMENTS

| | | | |
|---|---|---|---|
| 5,858,870 A | 1/1999 | Zheng et al. | |
| 5,869,394 A * | 2/1999 | Chen et al. | 438/624 |
| 6,017,780 A | 1/2000 | Roy | |
| 6,087,278 A | 7/2000 | Kim et al. | |
| 6,274,514 B1 | 8/2001 | Jang et al. | |
| 6,458,722 B1 * | 10/2002 | Kapoor et al. | 438/788 |
| 6,475,895 B1 | 11/2002 | Mei et al. | |
| 6,521,922 B1 * | 2/2003 | Huang et al. | 257/288 |
| 6,890,865 B1 * | 5/2005 | Yin et al. | 438/751 |
| 2003/0092284 A1 | 5/2003 | Huang et al. | |
| 2003/0168001 A1 | 9/2003 | Sneh | |
| 2003/0181030 A1 * | 9/2003 | Hsu et al. | 438/624 |
| 2003/0211725 A1 | 11/2003 | Chung et al. | |
| 2004/0005781 A1 * | 1/2004 | Huang et al. | 438/694 |
| 2005/0006712 A1 * | 1/2005 | Ngo et al. | 257/410 |

OTHER PUBLICATIONS

Dori, Leonello, et al., "Optimized Silicon-Rich Oxide (SRO) Deposition Process for 5-V-Only Flash EEPROM Applications," IEEE Electron Device Letters 14(6) (Jun. 1993) 283-285.

Shuto, Susumu, et al., "UV-blocking technology to reduce plasma-induced transistor damage in ferroelectric devices with low hydrogen resistance," IEEE, 37th Annual International Reliability Physics Symp, 1999, 356-361.

Ashburn, S. P. et al., Degradation of Deep Sub-micron Isolation by Vacuum Ultraviolet Radiation from Low Temperature Back End Plasma-Assisted Processes, IEEE, IEDM, 1997, pp. 449-452.

(Continued)

*Primary Examiner*—Michael Lebentritt
*Assistant Examiner*—Mohsen Ahmadi
(74) *Attorney, Agent, or Firm*—Kenta Suzue; Haynes Beffel & Wolfeld LLP

(57) ABSTRACT

Methods and apparatuses are disclosed relating to blocking ultraviolet electromagnetic radiation from a semiconductor. Ultraviolet electromagnetic radiation, such as ultraviolet electromagnetic radiation generated by a plasma process, which may otherwise damage a semiconductor can be blocked from one or more layers below an ultraviolet blocking layer.

23 Claims, 12 Drawing Sheets

OTHER PUBLICATIONS

Song, Seung-Chul et al., Avoiding Plasma induced Damage to Gate Oxide with Conductive Top Film (CTF) on PECVD Contact Etch Stop Layer, 2002 Symposium on VLSI Technology Digest of Technical Papers, pp. 72-73.

Thomas, N. et al., UV-Shifted Durable Silver Coating for Astronomical Mirrors, Submitted to Astronomical Telescopes and Instrumentation, Munich, Germany, Mar. 27-31, 2000, 14 pp.

* cited by examiner

ULTRAVIOLET BLOCKING LAYER

BACKGROUND OF THE INVENTION

1. Field of the Invention

Various embodiments relate in general to semiconductor devices and to processes for fabricating semiconductor devices. More particularly, various embodiments relate to semiconductors having an ultraviolet (UV) blocking layer and to processes for fabricating such semiconductors.

2. Description of Related Art

As device geometry has continued to shrink, dimensional requirements of devices become more exacting while the aspect ratios of etching or gap filling rise. Plasma process technology is indispensable for ULSI fabrication that meets these demands. Examples of plasma process applications include plasma implantation, plasma sputtering, physical vapor deposition (PVD), dry etching, and chemical vapor deposition (CVD), for example, plasma assisted CVD, plasma-enhancement CVD, and high-density plasma CVD.

However, plasma process-induced damage will cause severe damage on semiconductor devices and deteriorate the performance of semiconductor devices. Also, ultraviolet electromagnetic radiation (UV) induced from plasma process applications will alter device behavior and degrade gate oxide reliability. As described on page 356 of IEEE 99CH36296 37$^{th}$ Annual International Reliability Physics Symposium, San Diego, Calif., 1999, Shuto et al. used silicon nitride and silicon oxynitride to reduce plasma-induced damage. Unfortunately, neither the silicon nitride layer nor the silicon oxynitride layer used by Shuto et al. is sufficient to act as an ultraviolet blocking layer for plasma processes such as plasma-enhancement CVD or high-density plasma CVD. Thus there exists a need to provide an effective ultraviolet blocking layer for fabricating semiconductor devices.

SUMMARY

One aspect relates to providing a semiconductor device having a layer of silicon enriched oxide as a UV blocking layer to block process-induced ultraviolet electromagnetic radiation for improvement of device performance. The semiconductor device comprises a semiconductor substrate, and a layer of silicon enriched oxide having a ratio of a silicon concentration to an oxygen concentration sufficient for ultraviolet blocking. The layer of silicon enriched oxide can be formed from at least one of SiH4/N2O, SiH4/O2, TEOS/O2 and TEOS/O3 by conducting at least one of PECVD, SACVD and HDPCVD. The PECVD process can use SiH4/N2O and/or TEOS/O2. The HDPCVD process can use SiH4/O2. The SACVD process can use TEOS/O3. The layer of silicon enriched oxide may have a thickness of 100 Angstroms to 8000 Angstroms.

Another aspect relates to a method for fabricating semiconductor devices. The method comprises providing a semiconductor substrate, and forming a layer of silicon enriched oxide overlying the semiconductor substrate. The layer of silicon enriched oxide can be formed by selecting at least one of SiH4/O2, SiH4/N2O, TEOS/O2 and TEOS/O3, for example, by conducting plasma-enhancement chemical vapor deposition (PECVD), semi-atmosphere chemical vapor deposition (SACVD) and/or high-density plasma (HDPCVD).

Another aspect relates to a semiconductor processing method. An oxide enriched with silicon can be formed over a substrate. The substrate can include features. A process including UV radiation can be applied to define structure over the oxide. The oxide can have a ratio of a silicon concentration to an oxygen concentration sufficient to protect the features from the UV radiation.

Another aspect relates to another semiconductor processing method. A substrate is provided with a source of silicon and a source of oxygen. A ratio of a flow rate of the source of silicon to a flow rate of the source of oxygen is controlled, to form a silicon enriched layer on the substrate. The substrate can include features. The silicon enriched layer protects the features from UV radiation.

Other aspects and advantages of the present invention can be seen on review of the drawings, the detailed description and the claims which follow.

DETAILED DESCRIPTION

The Beer-Lambert Law describes the absorption of electromagnetic radiation by a layer as follows:

$$I = I_0 * e^{-\alpha d}$$

where $I_0$ represents the initial intensity of the electromagnetic radiation prior to absorption by the layer, I represents the intensity of the electromagnetic radiation as it has finished transiting the layer, d represents the layer thickness, and α represents the absorption coefficient. The ratio ($I/I_0$) indicates the percentage of electromagnetic radiation that successfully transits the layer. The absorption coefficient can also be expressed as follows:

$$\alpha = (4\pi K)/\lambda$$

where K represents the extinction coefficient and λ represents the wavelength. The extinction coefficient is a dimensionless quantity. Many embodiments of the invention include an ultraviolet blocking layer with a sufficiently high extinction coefficient.

Figure 1:
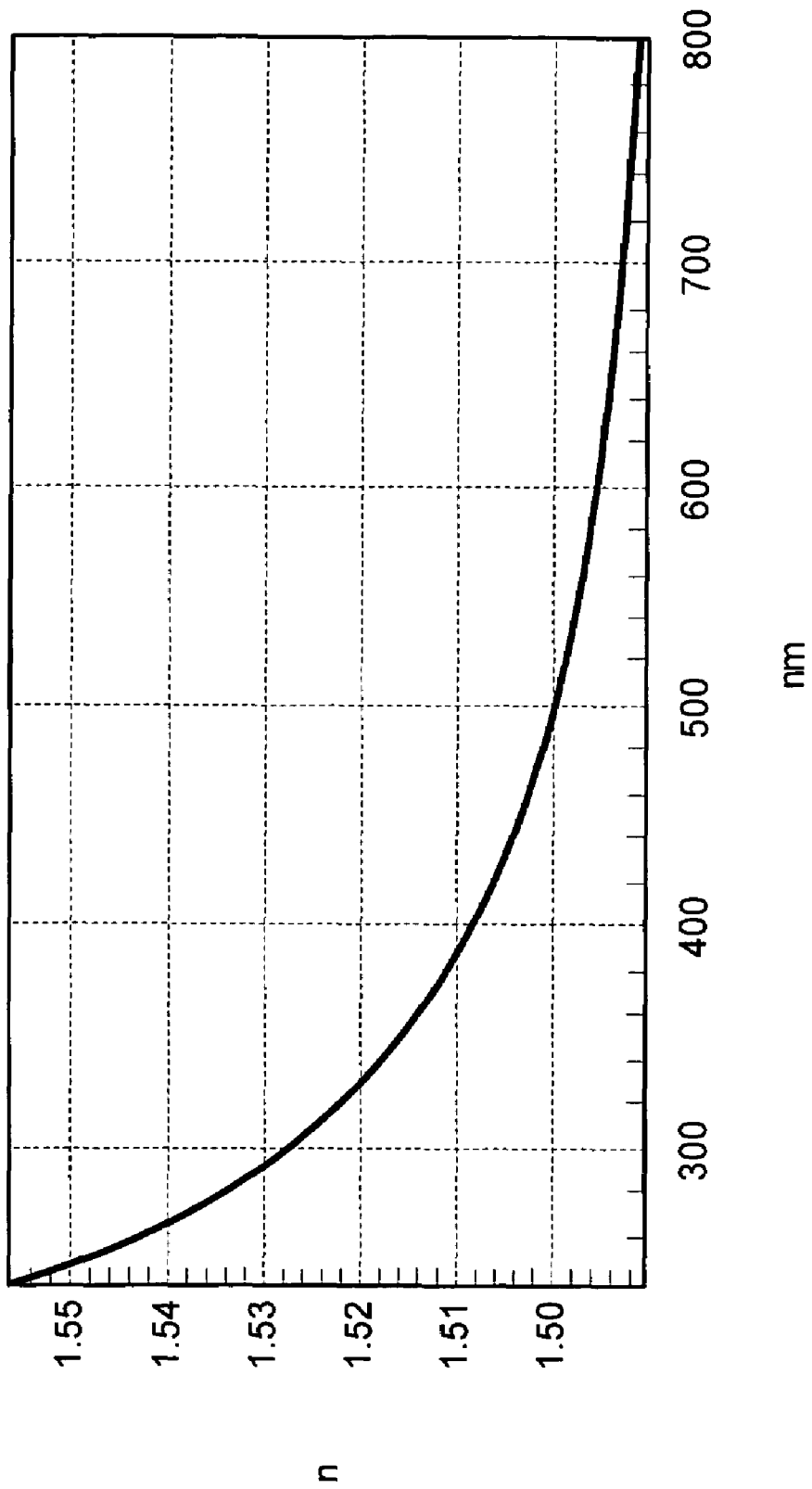
FIG. 1 is a graph of the index of refraction versus wavelength for a silicon oxide layer that is not appropriate for an ultraviolet blocking layer.
Figure 2:
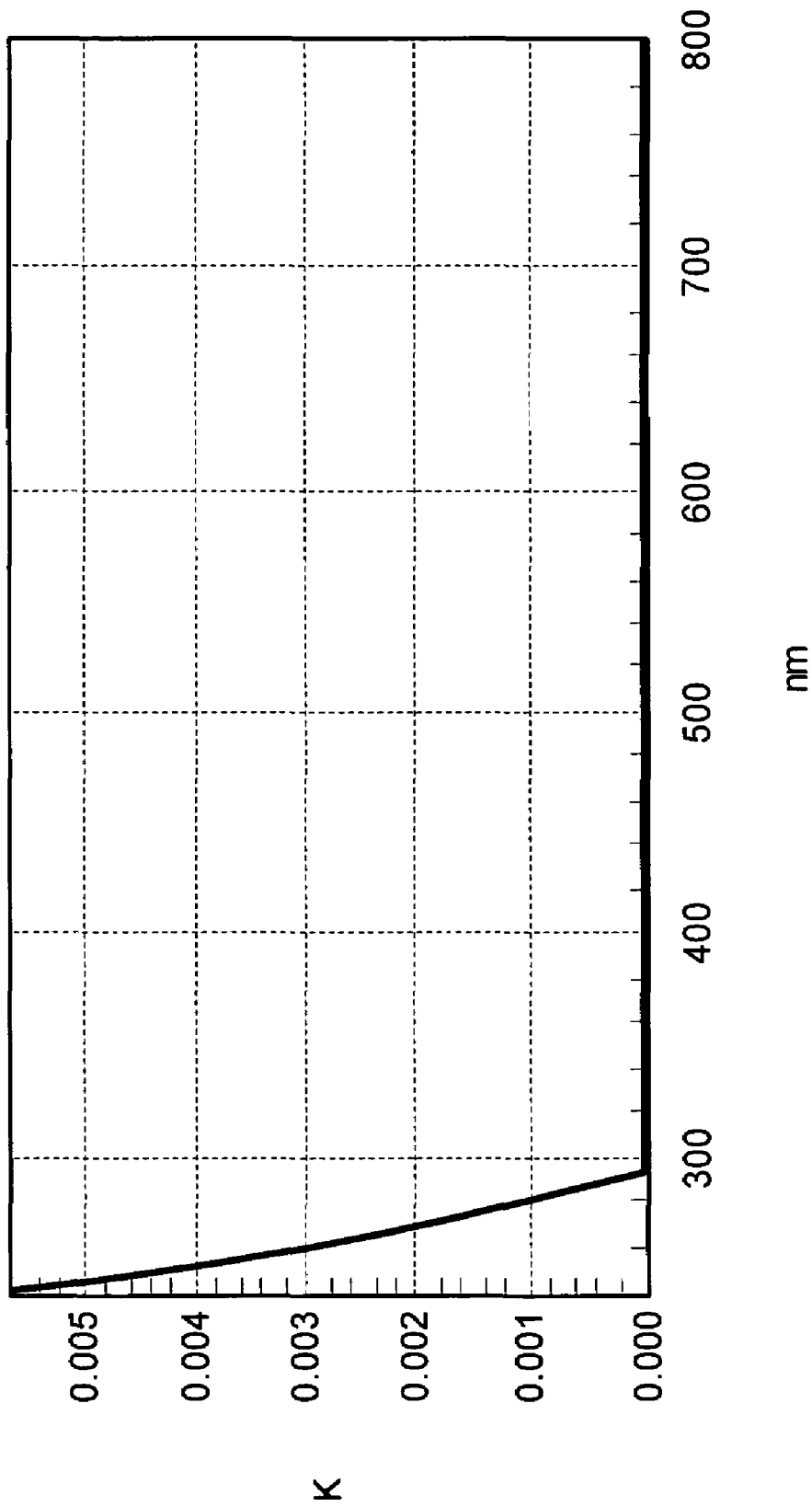
FIG. 2 is a graph of the extinction coefficient versus wavelength for a silicon oxide layer that is not appropriate for an ultraviolet blocking layer.

Many types of standard silicon oxide are not appropriate for an ultraviolet blocking layer. FIG. 1 shows a graph of the index of refraction versus wavelength for a silicon oxide layer that is not appropriate for an ultraviolet blocking layer. FIG. 2 shows a graph of the extinction coefficient versus wavelength for a silicon oxide layer that is not appropriate for an ultraviolet blocking layer. FIG. 2 shows that the values of the extinction coefficient for this silicon oxide layer are negligible, such that this silicon oxide layer is not practical as an ultraviolet blocking layer.

Figure 3:
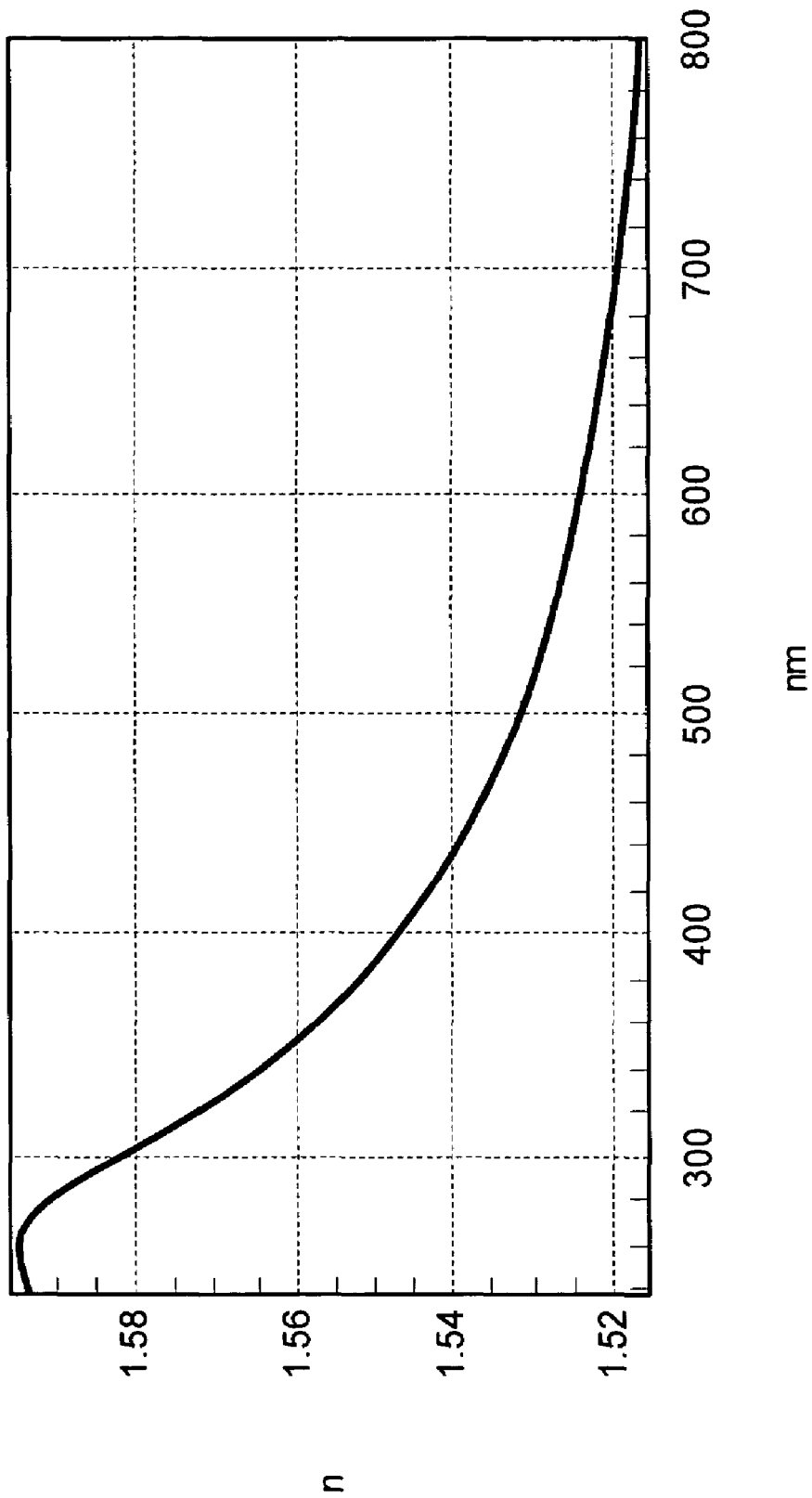
FIG. 3 is a graph of the index of refraction versus wavelength for a silicon rich oxide layer that is not appropriate for an ultraviolet blocking layer.
Figure 4:
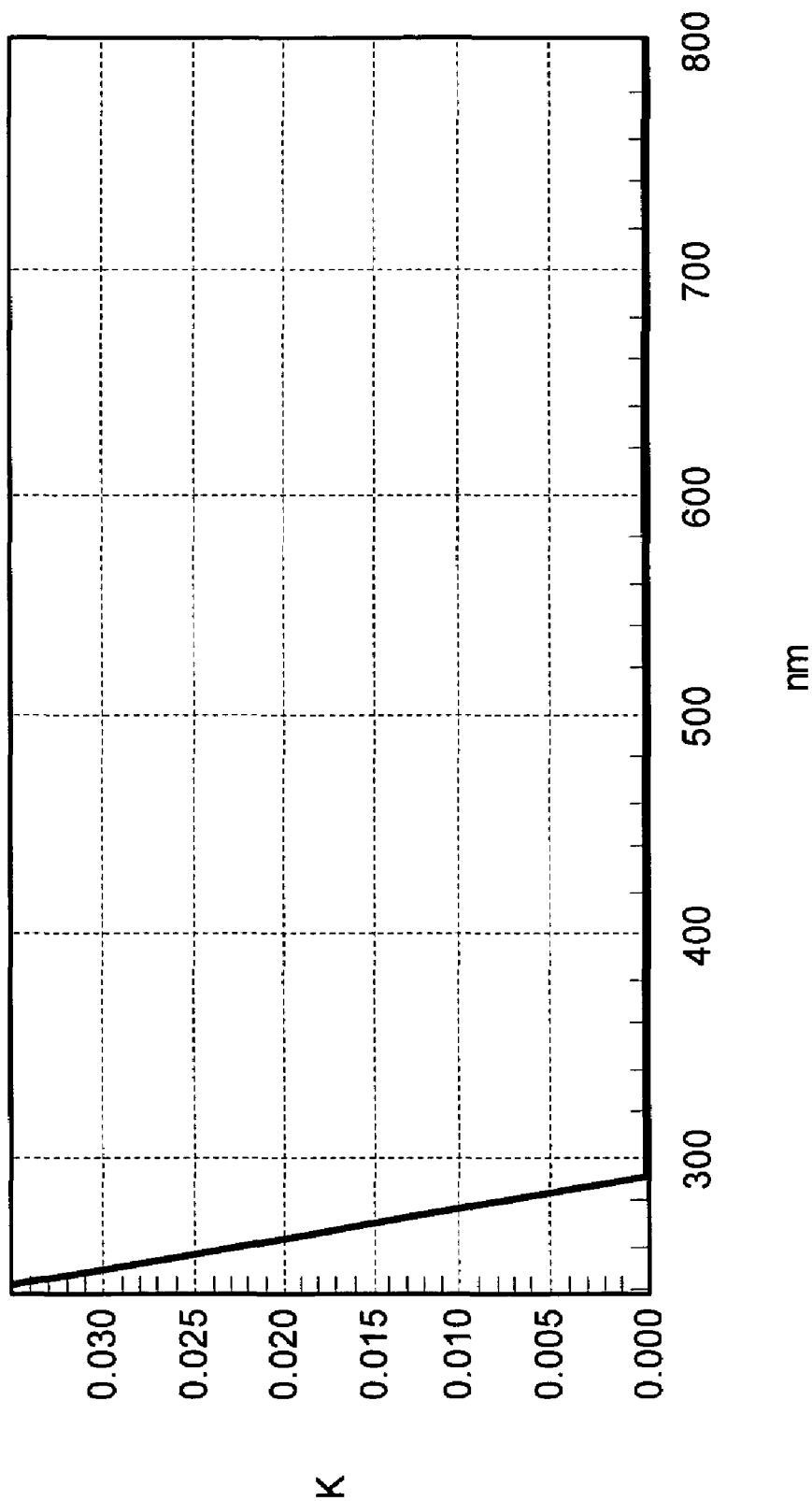
FIG. 4 is a graph of the extinction coefficient versus wavelength for a silicon rich oxide layer that is not appropriate for an ultraviolet blocking layer.

Many types of silicon rich oxide are not appropriate for an ultraviolet blocking layer. Silicon rich oxide contains more silicon than is expected from the chemical formula $SiO_2$. FIG. 3 shows a graph of the index of refraction versus wavelength for a silicon rich oxide layer that is not appropriate for an ultraviolet blocking layer. FIG. 4 shows a graph of the extinction coefficient versus wavelength for a silicon rich oxide layer that is not appropriate for an ultraviolet blocking layer. FIG. 4 shows that the values of the extinction coefficient for this silicon rich oxide layer are negligible, such that this silicon rich oxide layer is not practical as an ultraviolet blocking layer.

Some types of silicon rich oxide layers are appropriate for an ultraviolet blocking layer. Such silicon rich oxide layers can be called super silicon rich oxide (SSRO) layers, or silicon enriched oxide layers.

In embodiments of the present invention, the concentration of Si in the silicon oxide is increased until it is sufficient to act as an ultraviolet blocking layer. The amount of Si varies in various embodiments, and can be characterized by the extinction coefficient, by the ratio of silicon to oxygen in the material, and/or by the ratio of the flow rates of the sources.

In one embodiment, the layer of silicon rich oxide serving as the ultraviolet blocking layer is formed under the following conditions: the source gases of SiH4, O2, and Ar are introduced at respective flow rates of 100 sccm, 50 sccm, and 50 sccm at a low frequency RF power of 3000 W, and standard deposition time of 4 sec. Under such conditions, the silicon rich oxide can have a thickness of 600 Angstroms, an extinction coefficient of 1.7, and an index of refraction of 1.5 at 248 nm. In this case, the ratio of the silane flow rate to the oxygen flow rate is 2. Other embodiments can use different power levels, flow rates, flow rate ratios and/or source gases.

Figure 5:
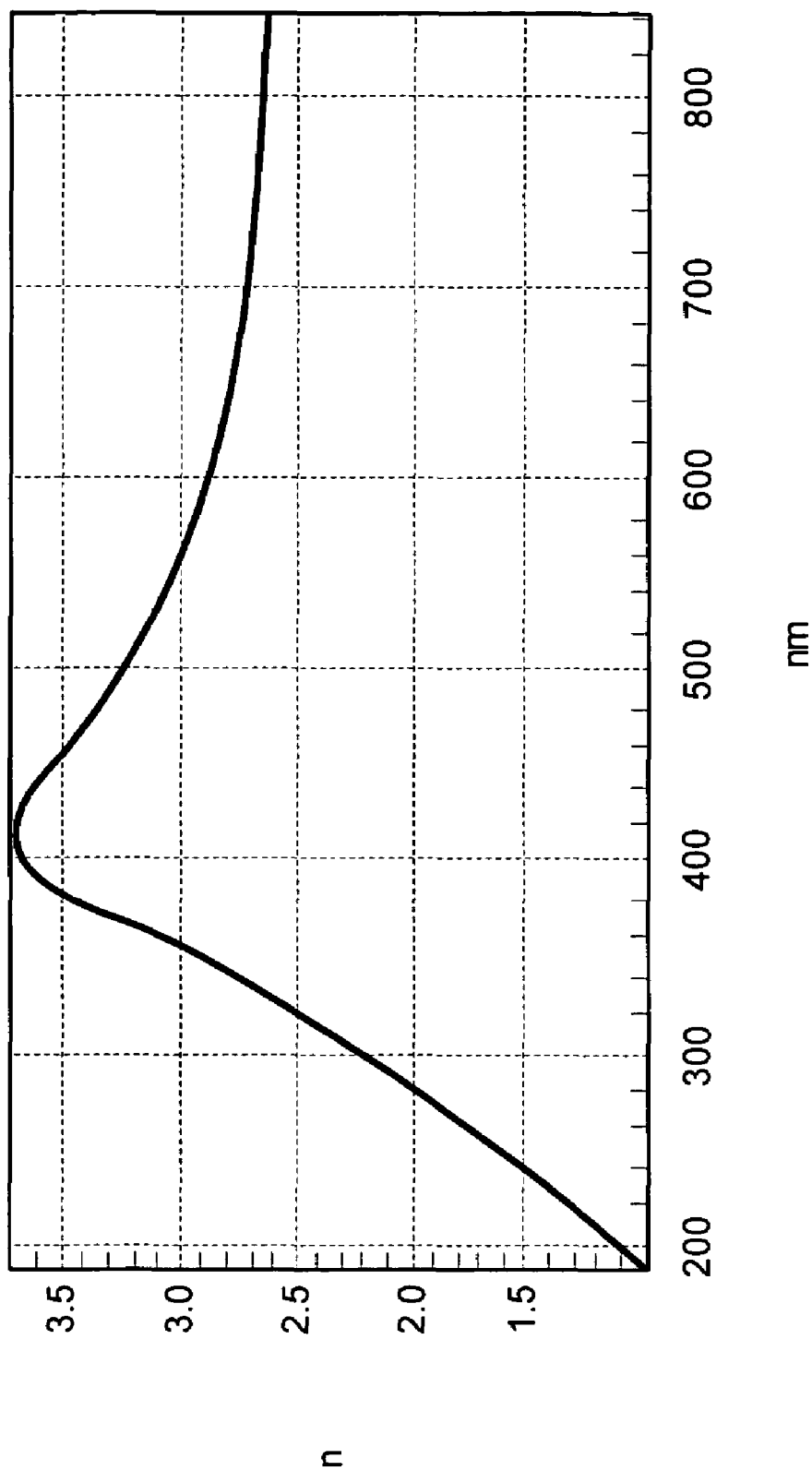
FIG. 5 is a graph of the index of refraction of the silicon rich oxide layer serving as an ultraviolet blocking layer versus wavelength.
Figure 6:
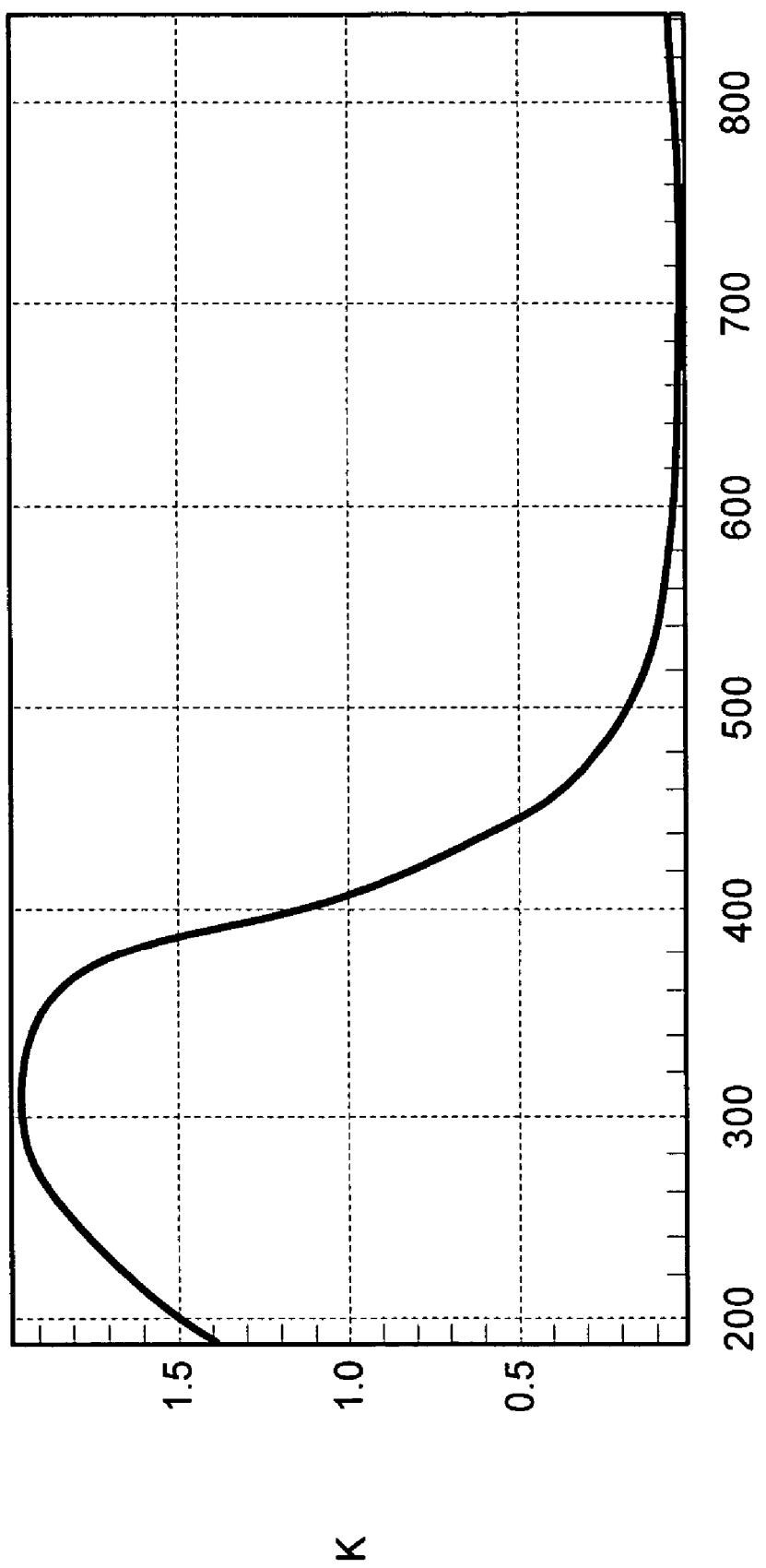
FIG. 6 is a graph of the extinction coefficient of the silicon rich oxide layer serving as an ultraviolet blocking layer versus wavelength.

FIG. 5 shows a graph of the index of refraction of the silicon rich oxide layer serving as an ultraviolet blocking layer versus wavelength. FIG. 6 shows a graph of the extinction coefficient of the silicon rich oxide layer serving as an ultraviolet blocking layer versus wavelength. Ultraviolet radiation includes electromagnetic radiation at wavelengths no longer than 400 nm. A subset of one or more wavelengths no longer than 400 nm is a range of wavelengths less than 400 nm.

Secondary ion mass spectroscopy (SIMS) analysis was performed on a semiconductor sample with a silicon rich oxide layer serving as an ultraviolet blocking layer formed on a silicon substrate, and a standard silicon oxide layer formed on the silicon rich oxide layer serving as an ultraviolet blocking layer. The ratio of the silicon concentration to the oxygen concentration in the standard silicon oxide layer was about 0.7. The ratio of the silicon concentration to the oxygen concentration in the silicon rich oxide layer was about 13.6. For another silicon rich oxide layer serving as an ultraviolet blocking layer having an extinction ratio of about 1.3 at a wavelength of 248 nm, the ratio of the silicon concentration to the oxygen concentration in the silicon rich oxide layer is about 10. In other embodiments, different ratios of the silicon concentration to the oxygen concentration, such as a ratio of at least about 10, can be achieved in the silicon rich oxide layer by customizing process parameters, such as the ratio of the flow rates of the sources.

The process time is a factor in the thickness of the silicon rich oxide layer. Layers can be substantially planar, can have irregular features, and/or can have irregular thicknesses.

Figure 13:
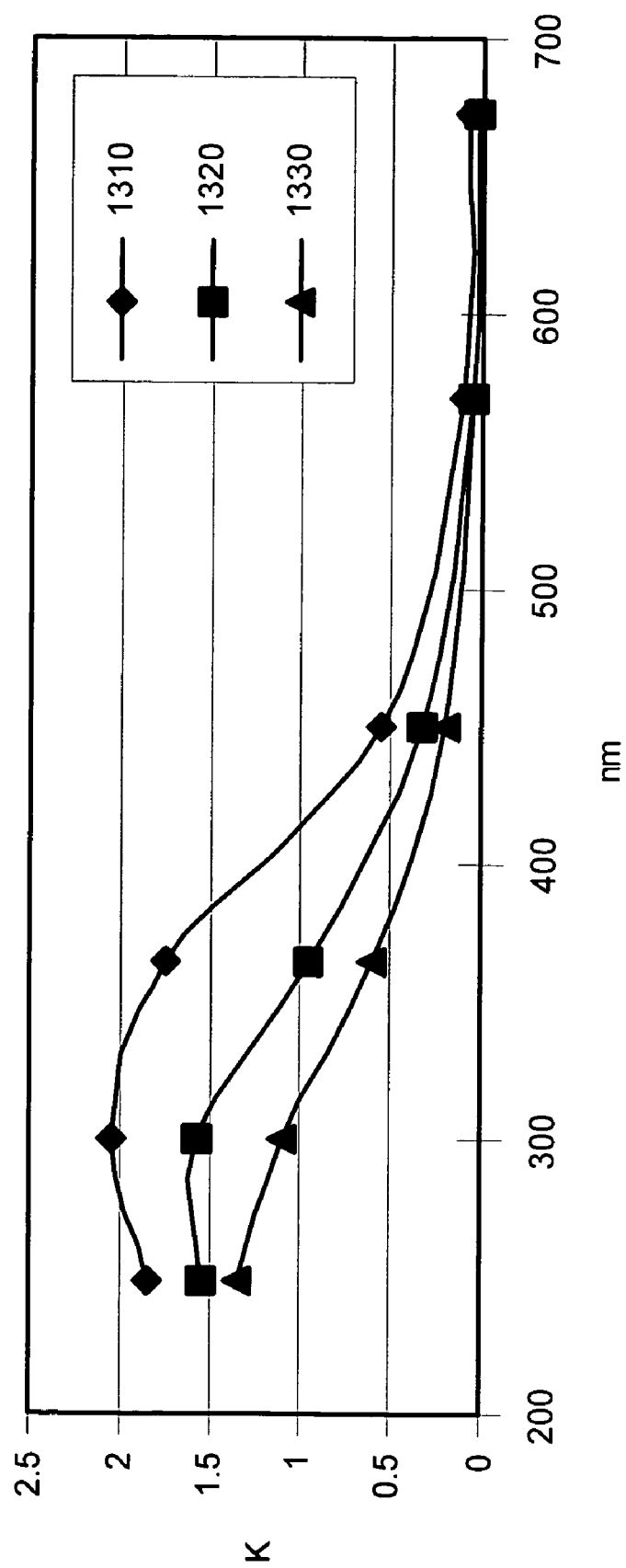
FIG. 13 is a graph of the extinction coefficient of ultraviolet electromagnetic radiation blocking for different samples of a silicon rich oxide layer serving as an ultraviolet blocking layer.

The ratio of SiH4 to O2 is a factor in controlling the extinction coefficient and the amount of extra silicon in the silicon rich oxide. FIG. 13 shows a graph of extinction coefficient versus wavelength for various silicon rich oxide layers serving as ultraviolet blocking layers that have been made with different flow rate ratios of SiH4 to O2. For all layers, the source gas of SiH4 is introduced at a flow rate of 100 sccm. The source gas of O2 is introduced at flow rates of 50 sccm, 60 sccm, and 70 sccm for silicon rich oxide layers serving as ultraviolet blocking layers 1310, 1320, and 1330 respectively. Generally, a higher flow rate ratio of SiH4 to O2 corresponds with a higher extinction coefficient. Table 1 shows the data for the graph of FIG. 13. The amount of silicon in the ultraviolet blocking layer can be characterized by the extinction ratio of the ultraviolet blocking layer. Thus, by showing how the extinction coefficient varies with the source gas flow rates, Table 1 and FIG. 13 show that one way to characterize the amount of silicon in an ultraviolet blocking layer is the ratio of source gases during the growth of the ultraviolet blocking layer.

TABLE 1

| Wavelength | Extinction Coefficients (K) for Layer 1310 | Extinction Coefficients (K) for Layer 1320 | Extinction Coefficients (K) for Layer 1330 |
| --- | --- | --- | --- |
| 248 nm | 1.8443 | 1.5487 | 1.3432 |
| 300 nm | 2.0377 | 1.5679 | 1.0943 |
| 365 nm | 1.7407 | 0.9482 | 0.6104 |
| 450 nm | 0.5458 | 0.3199 | 0.2034 |
| 570 nm | 0.1065 | 0.0438 | 0.0381 |
| 673 nm | 0.0661 | 0.0195 | 0.0254 |

Figure 7:
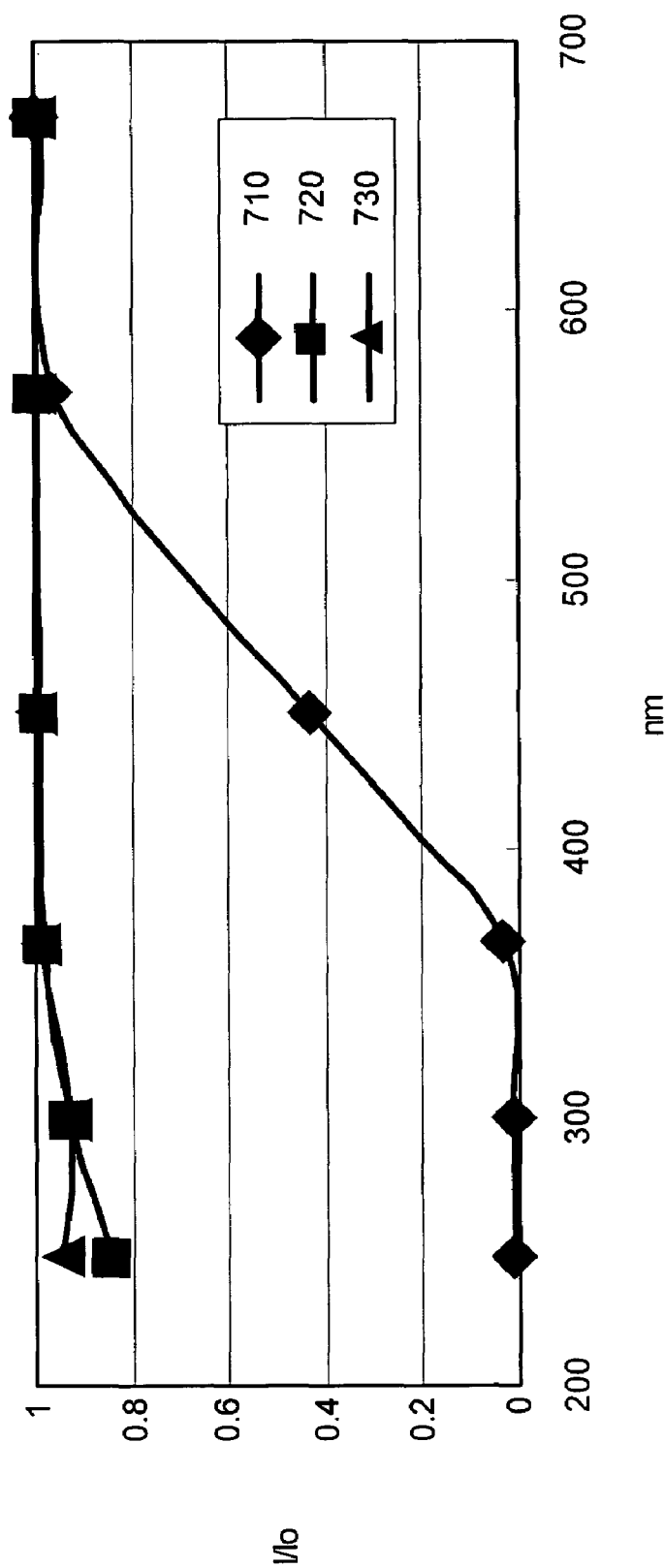
FIG. 7 is a graph of the efficiency of ultraviolet electromagnetic radiation blocking for a silicon rich oxide layer serving as an ultraviolet blocking layer, a silicon rich oxide layer not serving as an ultraviolet electromagnetic radiation blocking layer, and for a standard silicon oxide layer.

FIG. 7 shows a graph of the efficiency of ultraviolet electromagnetic radiation blocking for one embodiment with a silicon rich oxide layer serving as an ultraviolet blocking layer. The ultraviolet electromagnetic radiation blocking layer has a thickness of 600 Angstroms. The graph shows that ($I/I_0$), the percentage of electromagnetic radiation that successfully transits the ultraviolet electromagnetic radiation blocking layer 710, is approximately 100% for wavelengths longer than about 580 nm. As the wavelength becomes shorter, to about 350 nm, ($I/I_0$) drops to approximately 0%. Thus, for this embodiment, the ultraviolet electromagnetic radiation blocking layer is substantially transparent to longer wavelengths of about 580 nm or longer, substantially opaque to shorter wavelengths of about 350 nm or shorter, and substantially partly transparent for wavelengths between about 350 nm and 580 nm.

A layer need not have an $(I/I_0)$ ratio of 0% to serve as an ultraviolet electromagnetic radiation blocking layer. Various embodiments have an $(I/I_0)$ ratio sufficient to protect underlying features from UV damage in the particular manufacturing flow.

For comparison, the graph of FIG. 7 also shows the efficiency of ultraviolet electromagnetic radiation blocking for a silicon rich oxide layer not serving as an ultraviolet electromagnetic radiation blocking layer 720 and for a standard silicon oxide layer 730. For the silicon rich oxide layer not serving as an ultraviolet electromagnetic radiation blocking layer, the $(I/I_0)$ ratio is approximately 100% at around a wavelength of 700 nm down to about a wavelength of 400 nm, decreases to approximately 90% at around a wavelength of 300 nm, and then decreases to approximately 85% at around a wavelength of 250 nm. For the standard silicon oxide layer, the $(I/I_0)$ ratio is approximately 100% at around a wavelength of 700 nm down to about a wavelength of 400 nm, and decreases to approximately 90% at around a wavelength of 300 nm.

Figure 12:
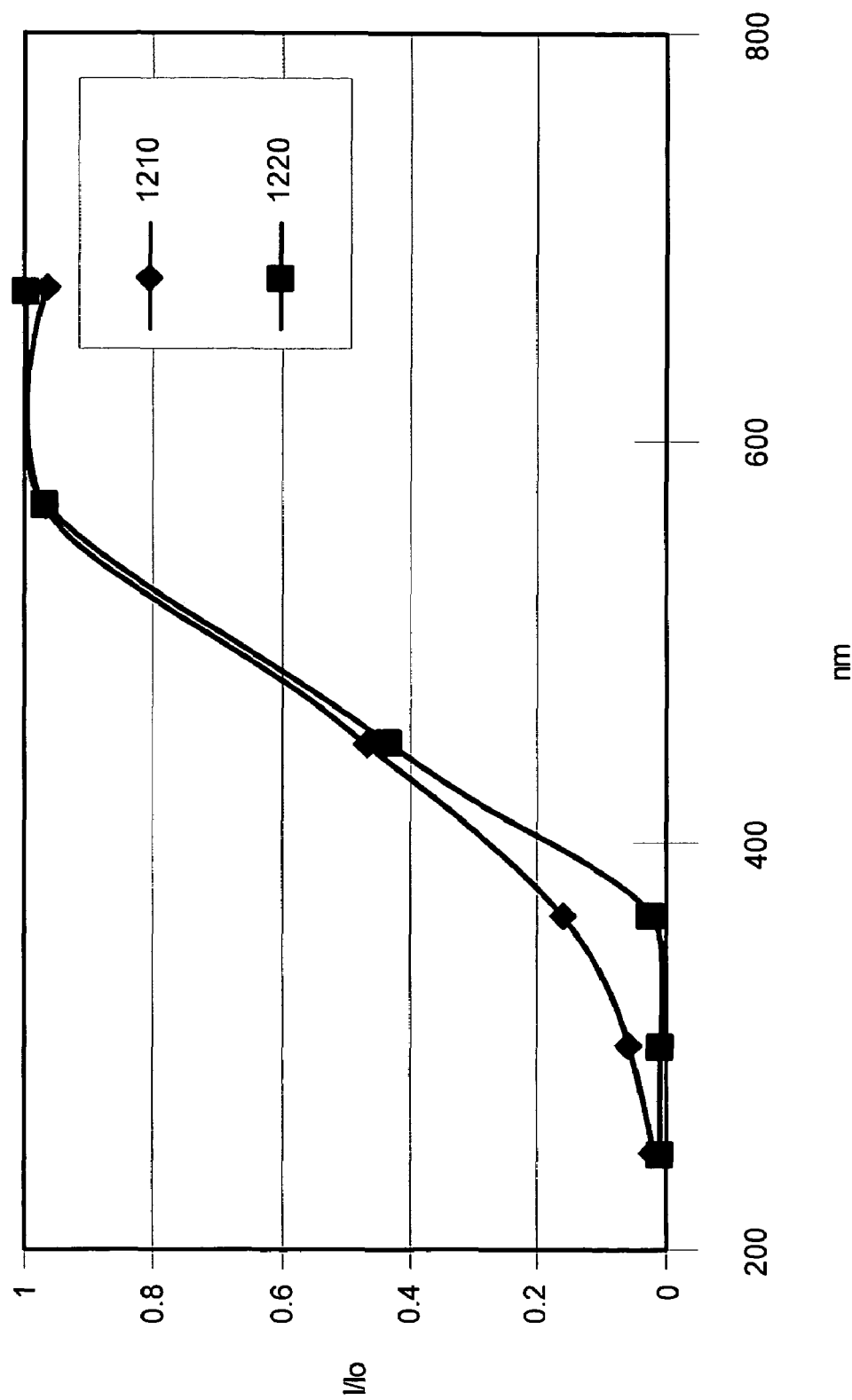
FIG. 12 is a graph of the efficiency of ultraviolet electromagnetic radiation blocking for different samples of a silicon rich oxide layer serving as an ultraviolet blocking layer.

The graph of FIG. 12 shows the efficiency of ultraviolet electromagnetic radiation blocking for different samples of a silicon rich oxide layer serving as an ultraviolet blocking layer. $(I/I_0)$, the percentage of electromagnetic radiation that successfully transits the ultraviolet electromagnetic radiation blocking layers 1210 and 1220, is approximately 100% for wavelengths longer than about 580 nm. For ultraviolet electromagnetic radiation blocking layer 1220, as the wavelength becomes shorter, to about 350 nm, $(I/I_0)$ drops to approximately 0%. Ultraviolet electromagnetic radiation blocking layer 1220 at a wavelength of 400 nm has a $(I/I_0)$ value of 15%. For ultraviolet electromagnetic radiation blocking layer 1210, as the wavelength becomes shorter, to about 350 nm, $(I/I_0)$ drops to approximately 15%, followed by a more gradual drop to about 0% as the wavelength shortens to about 248 nm. Ultraviolet electromagnetic radiation blocking layer 1221 at a wavelength of 400 nm has a $(I/I_0)$ value of 30%. Table 2 has data for ultraviolet electromagnetic radiation blocking layers 1210 and 1220.

TABLE 2

| Layer | Wavelength (λ) | Index of Refraction (n) | Extinction Coefficient (K) |
|---|---|---|---|
| 1210 | 248 nm | 1.43 | 1.3 |
| 1210 | 633 nm | 2.33 | 0.0031 |
| 1220 | 248 nm | 1.5 | 1.7 |
| 1220 | 633 nm | 2.79 | 0.0019 |

Figure 8:
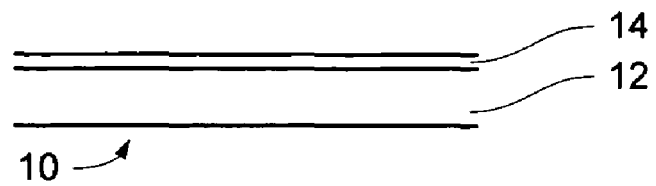
FIGS. 8–10 are cross-sectional views of semiconductor devices having a layer of silicon enriched oxide according to various embodiments.

FIG. 8 illustrates a cross-sectional view of a portion of a semiconductor device. Device 10 includes a semiconductor substrate 12 which can include, for example, a silicon wafer, and a layer of SSRO 14 overlying the semiconductor substrate 12. A layer overlying another layer, such as the substrate or wafer, may be adjacent to it, or be separated by other structures. A greater thickness of the SSRO 14 leads to greater UV blocking capability of the SSRO 14.

Figure 9:
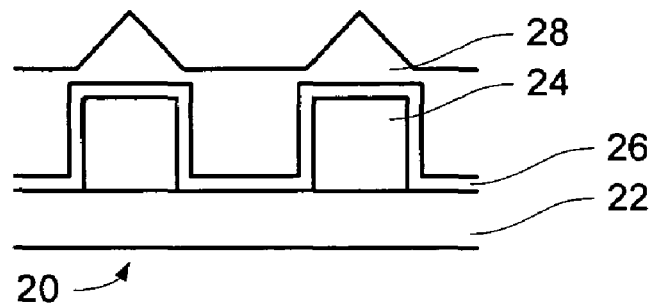
Figure 10:
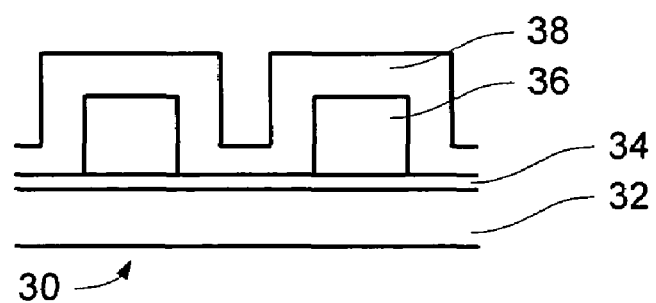

FIGS. 9 and 10 illustrate semiconductor devices with the SSRO used at different stages of processing. FIG. 9 shows the use of the SSRO at an earlier stage than in FIG. 10. In FIG. 9, SSRO is deposited after other features such as patterned conductors. In FIG. 10, the SSRO is deposited prior to other features such as patterned conductors. Another embodiment deposits SSRO both prior to and after other features.

FIG. 9 illustrates a cross-sectional view of a portion of a semiconductor device. Device 20 includes a semiconductor substrate 22 which can include, for example, a silicon wafer in which doped regions have been formed to provide various active regions of the semiconductor device, and overlying which various insulator and conductor layers may have been formed. All of the aforementioned regions and layers are well known in the art for forming integrated device structures and need not be shown or described herein. Device 20 further includes a plurality of patterned conductors 24 overlying the semiconductor substrate 22, and a layer of SSRO 26 overlying the semiconductor substrate 22 and the patterned conductors 24. A layer of dielectric 28 overlies the layer of SSRO 26.

A method of fabricating a semiconductor device is described below. Referring to FIG. 9, a semiconductor substrate 22 is provided. A plurality of patterned conductors 24 is formed overlying the semiconductor substrate 22. The patterned conductors 24 can be polysilicon, polysilicon/silicide composite or metal, for example. Representative metals include a metal selected from a group consisting of aluminum, aluminum alloy and copper. A layer of SSRO 26 is formed overlying the semiconductor substrate 22 and the patterned conductors 24. And then a layer of dielectric 28 is formed overlying the layer of SSRO 26. The dielectric 28 is silicon oxide or silicon nitride and may be deposited by conducting PECVD, SACVD or HDPCVD, for example.

The layer of SSRO 26 has an extinction coefficient of about 1.3 to about 4. It can be deposited using SiH4/O2, SiH4/N2O, TEOS/O2, TEOS/O3 or a combination as process resource and argon or helium as carrier gas by conducting HDPCVD, PECVD or SACVD. The layer of SSRO 26 can be formed by SiH4/O2 at a flow rate of about 50~200 sccm/20~100 sccm. The layer of SSRO 26 can have a thickness of about 200 Angstroms to 1000 Angstroms and has a refractive index of about 2 to 5 at a range of wavelengths below 400 nm. Control of the thickness of the SSRO 26 can optimize the gap-filling performance of the dielectric 28. Thus, the appropriate thickness of the SSRO 26 can depend on the aspect ratio of the pattern. The extinction coefficient, refractive index and thickness of the layer of SSRO can vary with adjusting the process parameters such as flow rate of process resources, power or process time. The SSRO 26 serves as an ultraviolet blocking layer during the deposition of the dielectric 28.

Referring to FIG. 10, another semiconductor device is illustrated. Device 30 includes a semiconductor substrate 32 which can include, for example, a silicon wafer in which doped regions have been formed, layers of insulator and conductor may be formed overlying the semiconductor substrate. The details of the region, insulator and conductor are not illustrated as they are well known in the art. Device 30 further includes a layer of SSRO 34 overlying the semiconductor substrate 32, a plurality of patterned conductors 36 overlying the layer of SSRO 34, and may have a layer of dielectric 38 overlying the patterned conductors. A method of fabricating a semiconductor device is described. Referring to FIG. 10, a semiconductor substrate 32 is provided. A layer of SSRO 34 is formed overlying the semiconductor substrate 32. The layer of SSRO 34 has an extinction coefficient of about 1.3 to 4. It can be deposited using SiH4/O2, SiH4/N2O, TEOS/O2, TEOS/O3 or a combination as process resource and argon or helium as carrier gas by conducting HDPCVD, PECVD or SACVD. The layer of SSRO 34 can have a thickness of about 1000 Angstroms to 3000 Angstroms and has a refractive index of about 2 to 5. A plurality of patterned conductors 36 is formed overlying the layer of SSRO 34. The conductors can be polysilicon, polysilicon/silicide composite or metal, for example. Representative metals include aluminum, aluminum alloys, copper and copper alloys. A layer of dielectric 38 can be formed overlying the patterned conductors 36. The dielectric is silicon oxide or silicon nitride and is deposited by conducting PECVD, SACVD or HDPCVD, for example. The SSRO 34 serves as an ultraviolet blocking layer during the deposition of the dielectric 38.

The features and processes discussed above for FIGS. 9 and 10 are applicable to FIG. 8.

By tuning process parameters such as the ratio of the flow rates of the sources, other embodiments can be made which have a refractive index greater than about 1.6 for a range of wavelengths less than 400 nanometers, an extinction coefficient at least about 1.3 for a range of wavelengths less than 400 nanometers.

Figure 11:
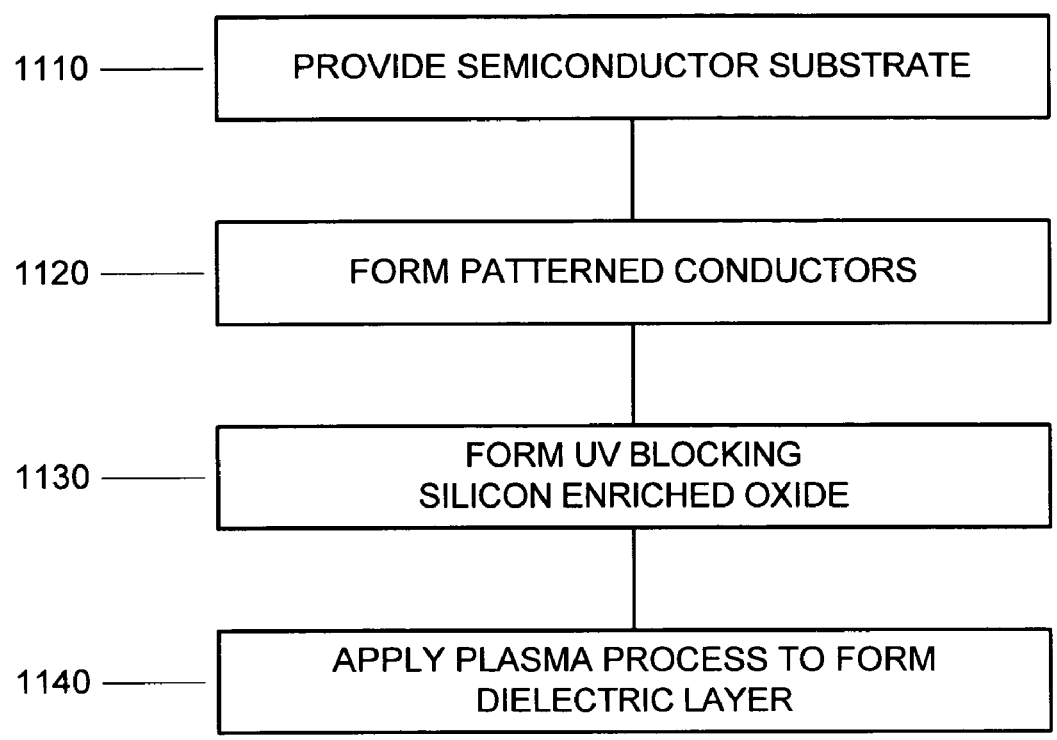
FIG. 11 is a simplified process flow for processing a semiconductor.

FIG. 11 is a simplified process flow for processing a semiconductor. In 1110, a semiconductor substrate is provided. In 1120, a layer of patterned conductors, or other structure sensitive to UV radiation, is formed. In 1130, a layer of silicon enriched oxide is formed. In 1140, a plasma process, such as HDPCVD or other process using or generating UV radiation, for forming a structure such as a dielectric layer, is performed. Parts of the process flow can be rearranged, added to, deleted, combined, or otherwise modified. For example, patterned conductors can be formed after the silicon enriched oxide is formed, to replace or complement patterned conductors formed prior to the silicon enriched oxide.

Figure 14:
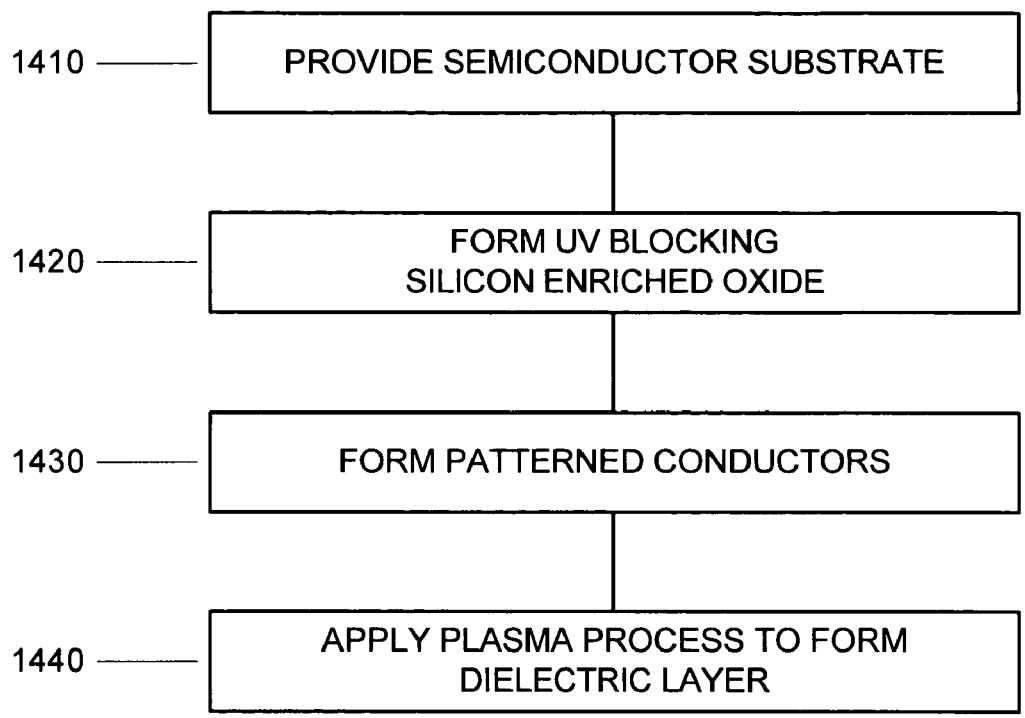
FIG. 14 is another simplified process flow for processing a semiconductor.

FIG. 14 is another simplified process flow for processing a semiconductor. The process flow is similar to the process flow of FIG. 11. However, in 1420, a layer of silicon enriched oxide is formed prior to 1430, when a layer of patterned conductors, or other structure sensitive to UV radiation, is formed.

Figure 15:
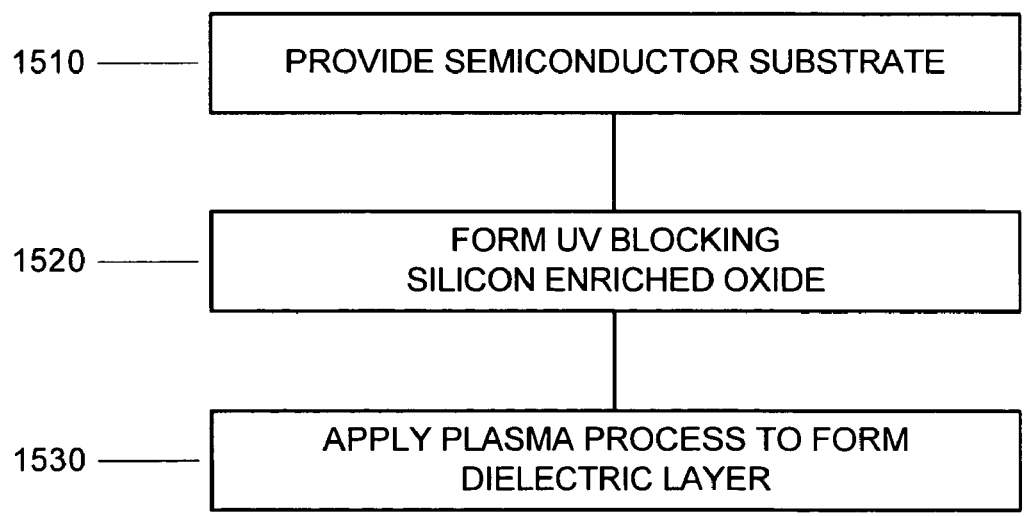
FIG. 15 is yet another simplified process flow for processing a semiconductor.

FIG. 15 is another simplified process flow for processing a semiconductor. The process flow is similar to the process flow of FIGS. 11 and 14. However, the process flow stops after 1520, when a layer of silicon enriched oxide is formed.

While various embodiments have been described, it is to be understood that the invention is not limited to the disclosed embodiments. Various substitutions and modifications have been suggested in the foregoing description, and others will occur to those of ordinary skill in the art. The invention is intended to cover all such substitutions and modifications included within the spirit and scope of the appended claims.

The invention claimed is:

1. A method for fabricating a semiconductor device having an ultraviolet blocking layer comprising the steps of:
providing a semiconductor substrate; and
forming a layer of silicon enriched oxide overlying said semiconductor substrate, said layer of silicon enriched oxide having a ratio of a silicon concentration to an oxygen concentration sufficient for ultraviolet blocking, wherein the ratio is at least about 10.

2. The method of claim 1, wherein said layer of silicon enriched oxide has an extinction coefficient of at least 1.3 for a range of wavelengths less than 400 nanometers.

3. The method of claim 1, wherein said layer of silicon enriched oxide has a refractive index greater than about 1.6 for a range of wavelengths less than about 400 nanometers.

4. The method of claim 1, wherein said layer of silicon enriched oxide has a thickness of 100 Angstroms to 8000 Angstroms.

5. The method of claim 1, wherein said layer of silicon enriched oxide has a refractive index of at least about 1.6 for a range of wavelengths less than 400 nanometers.

6. The method of claim 1, wherein said layer of silicon enriched oxide is formed by at least one of $SiH_4/O_2$, $SiH_4/N_2O$, $TEOS/O_2$, and $TEOS/O_3$.

7. The method of claim 1, including using at least one of argon and helium as a carrier gas when forming said layer of silicon enriched oxide.

8. The method of claim 1, wherein said layer of silicon enriched oxide is formed by at least one of plasma-enhancement chemical vapor deposition (PECVD), semi-atmosphere chemical vapor deposition (SACVD) and high-density plasma chemical vapor deposition (HDPCVD).

9. The method of claim 1, further comprising the steps of:
forming a plurality of patterned conductors, such that the plurality of patterned conductors overlie the semiconductor substrate and the silicon enriched oxide overlies the plurality of patterned conductors; and
forming a layer of dielectric overlying said layer of silicon enriched oxide.

10. The method of claim 1, further comprising the steps of:
forming a plurality of patterned conductors, such that the plurality of patterned conductors overlie the semiconductor substrate and the silicon enriched oxide overlies the plurality of patterned conductors; and
forming a layer of dielectric overlying said layer of silicon enriched oxide,
wherein said layer of silicon enriched oxide has a thickness of about 200 to 1000 Angstroms.

11. The method of claim 1, further comprising the steps of:
forming a plurality of patterned conductors, such that the plurality of patterned conductors overlie the semiconductor substrate and the silicon enriched oxide overlies the plurality of patterned conductors; and
forming a layer of dielectric overlying said layer of silicon enriched oxide,
wherein said layer of silicon enriched oxide has an extinction coefficient of at least about 1.3 for a range of wavelengths less than 400 nanometers.

12. The method of claim 1, further comprising the steps of:
forming a plurality of patterned conductors, such that the plurality of patterned conductors overlie the semiconductor substrate and the silicon enriched oxide overlies the plurality of patterned conductors; and
forming a layer of dielectric overlying said layer of silicon enriched oxide,
wherein said layer of silicon enriched oxide is formed by at least one of HDPCVD, PBCVD and SACVD.

13. The method of claim 1, further comprising the steps of:
forming a plurality of patterned conductors, such that the plurality of patterned conductors overlie the semiconductor substrate and the silicon enriched oxide overlies the plurality of patterned conductors; and
forming a layer of dielectric overlying said layer of silicon enriched oxide,
wherein said layer of silicon enriched oxide is formed by one or more of $SiH_4/O_2$, $SiH_4/N_2O$, $TEOS/O_2$, and $TEOS/O_3$.

14. The method of claim 1, further comprising the steps of:
forming a plurality of patterned conductors, such that the plurality of patterned conductors overlie the semiconductor substrate and the silicon enriched oxide overlies the plurality of patterned conductors; and forming a layer of dielectric overlying said layer of silicon enriched oxide,
wherein said layer of silicon enriched oxide is formed by one or more of SiH4/O2, SiH4/N2O, TEOS/O2, and TEOS/O3, and
wherein said layer of silicon enriched oxide is formed by using at least one of argon and helium as a carrier gas.

15. The method of claim 1, further comprising the steps of:
forming a plurality of patterned conductors, such that the plurality of patterned conductors overlie the semiconductor substrate and the silicon enriched oxide overlies the plurality of patterned conductors; and
forming a layer of dielectric overlying said layer of silicon enriched oxide,
wherein said layer of silicon enriched oxide is formed by SiH4 at a flow rate of about 50~200 seem and O2 at a flow rate of about 20~100 sccm.

16. The method of claim 1, further comprising the steps of:
forming a plurality of patterned conductors, such that the plurality of patterned conductors overlie the semiconductor substrate and the silicon enriched oxide overlies the plurality of patterned conductors; and
forming a layer of dielectric overlying said layer of silicon enriched oxide,
wherein said conductors comprise at last one of polysilicon, polysilicon/silicide composite aluminum, aluminum alloy, and copper.

17. The method of claim 1, further comprising the steps of:
forming a plurality of patterned conductors, such that the plurality of patterned conductors overlie the semiconductor substrate and the silicon enriched oxide overlies the plurality of patterned conductors; and
forming a layer of dielectric overlying said layer of silicon enriched oxide,
wherein said dielectric is at least one of silicon oxide and silicon nitride and is deposited by at least one of PECVD, HDPCVD and SACVD.

18. The method of claim 1, further comprising the steps of:
forming a plurality of patterned conductors overlying said layer of silicon enriched oxide.

19. The method of claim 1, further comprising the steps of:
forming a plurality of patterned conductors overlying said layer of silicon enriched oxide,
wherein said layer of silicon enriched oxide has a thickness of 1000 Angstroms to 3000 Angstroms.

20. The method of claim 1, further comprising the steps of:
forming a plurality of patterned conductors overlying said layer of silicon enriched oxide,
wherein said layer of silicon enriched oxide has an extinction coefficient of at least about 1.3 for a range of wavelengths less than 400 nanometers.

21. The method of claim 1, further comprising the steps of:
forming a plurality of patterned conductors overlying said layer of silicon enriched oxide,
wherein said layer of silicon enriched oxide is formed by at least one of HDPCVD, PECVD, and SACVD.

22. The method of claim 1, further comprising the steps of:
forming a plurality of patterned conductors overlying said layer of silicon enriched oxide,
wherein said layer of silicon enriched oxide is formed by selecting one or more reactants, at least one reactant of the one or more reactants from a group of reactants consisting of SiH4/O2, SiH4/N2O, TEOS/O2, and TEOS/O3.

23. The semiconductor device method of claim 1, further comprising the steps of:
forming a plurality of patterned conductors overlying said layer of silicon enriched oxide,
wherein said conductors comprise at least one of polysilicon, polysilicon/silicide composite, aluminum, aluminum alloy, and copper.

* * * * *

UNITED STATES PATENT AND TRADEMARK OFFICE
CERTIFICATE OF CORRECTION

PATENT NO. : 7,157,331 B2 Page 1 of 1
APPLICATION NO. : 10/858352
DATED : January 2, 2007
INVENTOR(S) : Chien Hung Lu and Chin Ta Su It is certified that error appears in the above-identified patent and that said Letters Patent is hereby corrected as shown below:

In claim 12, column 8, line 49, cancel "PBCVD" and replace with -- PECVD --.

In claim 15, column 9, line 17, cancel "seem" and replace with -- sccm --.

In claim 23, column 10, line 33, delete the words "semiconductor device".

Signed and Sealed this

Fourth Day of December, 2007

JON W. DUDAS
*Director of the United States Patent and Trademark Office*